United States Patent
Liao et al.

(10) Patent No.: US 10,502,775 B2
(45) Date of Patent: Dec. 10, 2019

(54) TESTING EQUIPMENT FOR SEMICONDUCTOR ELEMENT AND ITS CARRYING DEVICE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chih-Chieh Liao, Hsinchu (TW); Yu-Min Sun, Hsinchu (TW); Chih-Feng Cheng, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 120 days.

(21) Appl. No.: 15/814,415

(22) Filed: Nov. 16, 2017

(65) Prior Publication Data
US 2019/0064247 A1    Feb. 28, 2019

(30) Foreign Application Priority Data
Aug. 29, 2017 (CN) .......................... 2017 1 0754468

(51) Int. Cl.
*G01R 31/26* (2014.01)
*G01R 31/28* (2006.01)
(Continued)

(52) U.S. Cl.
CPC ..... *G01R 31/2601* (2013.01); *G01R 31/2875* (2013.01); *H01L 21/673* (2013.01);
(Continued)

(58) Field of Classification Search
CPC ............ G01R 31/2601; G01R 31/2875; H01L 21/6838; H01L 21/673; H01L 21/67017; H01L 21/67248
See application file for complete search history.

(56) References Cited

U.S. PATENT DOCUMENTS 6,399,484 B1 * 6/2002 Yamasaki ........... C23C 16/0281
257/E21.168
10,217,615 B2 * 2/2019 Singh ................ H01L 21/67248
(Continued)

FOREIGN PATENT DOCUMENTS

| CN | 104122462 A | 10/2014 |
|---|---|---|
| CN | 106483440 A | 3/2017 |
| TW | 449772 B | 8/2001 |

*Primary Examiner* — Dominic E Hawkins
(74) *Attorney, Agent, or Firm* — CRC & Partners Co., LLC

(57) ABSTRACT

A carrying device includes a main body, a grasping portion, a heat-exchanging module and a gas chamber device. The grasping portion is connected to the main body for grasping a semiconductor element. The heat-exchanging module is disposed on the main body. The gas chamber device includes a case body and a gas. The case body is disposed between the grasping portion and the heat-exchanging module, and has a closed chamber therein. The gas fills the closed chamber for transferring heat from the semiconductor element to the heat exchanging module, in which a specific heat capacity of the gas is about between 5000 J/(kg·K)-15000 J/(kg·K).

10 Claims, 6 Drawing Sheets

(51) Int. Cl.
*H01L 21/67* (2006.01)
*H01L 21/673* (2006.01)
*H01L 21/683* (2006.01)

(52) U.S. Cl.
CPC .. *H01L 21/67017* (2013.01); *H01L 21/67248* (2013.01); *H01L 21/6838* (2013.01)

(56) References Cited

U.S. PATENT DOCUMENTS

| | | | | |
|---|---|---|---|---|
| 2001/0048513 | A1* | 12/2001 | Nagahashi | G03F 7/70858 355/53 |
| 2004/0013418 | A1* | 1/2004 | Kusuda | H01L 21/67115 392/407 |
| 2005/0036267 | A1* | 2/2005 | Savas | C23C 16/4586 361/234 |
| 2011/0222038 | A1* | 9/2011 | Yamashita | C23C 16/4581 355/53 |
| 2013/0042803 | A1* | 2/2013 | Saido | C23C 16/45578 117/88 |
| 2014/0253168 | A1* | 9/2014 | Choi | G01R 31/2893 324/757.04 |
| 2015/0332942 | A1* | 11/2015 | Peh | H01L 21/67109 165/253 |

* cited by examiner

TESTING EQUIPMENT FOR SEMICONDUCTOR ELEMENT AND ITS CARRYING DEVICE

RELATED APPLICATIONS

This application claims priority to China Application Serial Number 201710754468.3, filed Aug. 29, 2017, which is herein incorporated by reference.

BACKGROUND

Field of Disclosure

The present disclosure relates to a testing equipment. More particularly, the present disclosure relates to a testing equipment for semiconductor element.

Description of Related Art

In general, after semiconductor package components (e.g., semiconductor circuit chips) are fabricated, the semiconductor package components (called DUT hereinafter) will be electrically tested to ensure the quality of the DUT at the time of shipment. While being electrically tested, the DUT is disposed on a test socket of a testing device, and a pressing head is moved downwardly to press the DUT tightly so that the DUT is ensured to be effectively electrically connected to the test socket for performing the test procedure on the DUT.

However, when the pressing head is pressed downwards the DUT tightly, heat will be accumulated rapidly on the pressing head, thus not only overheating and damaging the DUT due to the thermal accumulation issue, but also causing test data of the DUT to be not accurate enough and affecting the test results.

SUMMARY

According to one embodiment, a carrying device includes a main body, a grasping portion, a heat-exchanging module and a gas chamber device. The grasping portion is connected to the main body for grasping a semiconductor element. The heat-exchanging module is disposed on the main body. The gas chamber device includes a case body and a gas. The case body is disposed between the grasping portion and the heat-exchanging module, and the case body has a closed chamber therein. The gas fills the closed chamber for transferring heat from the semiconductor element to the heat exchanging module in which a specific heat capacity of the gas is in a range from about 5000 J/(kg·K) to about 15000 J/(kg·K).

According to another embodiment, a testing equipment includes a circuit board, a test socket and the aforementioned carrying device. The test socket is disposed on the circuit board and is connected to the circuit board. The aforementioned carrying device carries the semiconductor element to the test socket, and presses against the semiconductor element onto the test socket, and the aforementioned carrying device electrically connects the semiconductor element to the circuit board through the test socket.

Thus, through the above embodiments, because the specific heat capacity of the specific gas of the carrying device is relatively high, the temperature of the gas chamber device will not be increased rapidly, so that heat on the semiconductor element will not be accumulated quickly on the main body so as to reduce thermal impact on a tested component (DUT) of the testing equipment due to heat of the main body, thereby reducing the possibility of overheating and damaging the DUT due to the thermal accumulation issue, and preventing test data of the DUT from being not accurate enough and affecting the test results.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. In the drawings.

DESCRIPTION OF THE EMBODIMENTS

Figure 1:
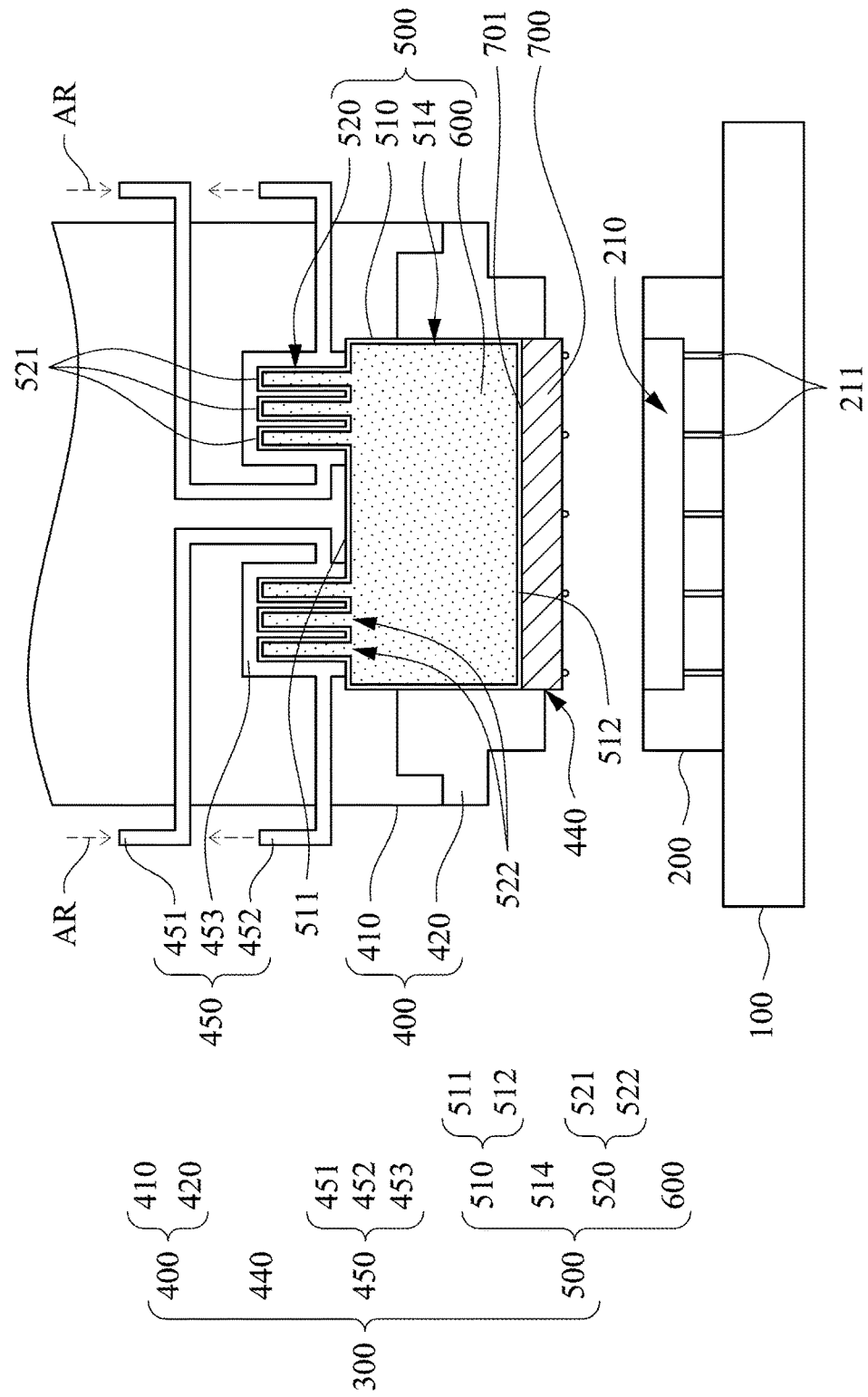
FIG. 1 is a side view of a testing equipment according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Reference is now made to FIG. 1 in which FIG. 1 is a side view of a testing equipment 10 according to one embodiment of the present disclosure. As shown in FIG. 1, in the embodiment, the testing equipment 10 includes a circuit board 100, a test socket 200 and a carrying device 300. The test socket 200 is disposed on the circuit board 100, and a surface of the test socket 200 opposite to the circuit board 100 is provided with a recess 210. Connection portions 211 are provided in the recess 210 for electrically connecting to the circuit board 100. The carrying device 300 is movable relative to the test socket 200 so as to be moved to the above of the recess 210 of the test socket 200, or away from the above of the recess 210.

As shown in FIG. 1, the carrying device 300 includes a main body 400, a grasping portion 440, at least one heat-exchanging module 450 and a gas chamber device 500. The grasping portion 440 is connected to one end of the main body 400, and grasping portion 440 removably grasps a semiconductor element 700 (e.g., semiconductor circuit chips). For example, the grasping portion 440 may be a placement recess, a grasping robot arm, an adsorbing sucker or other similar tools capable of grasping the semiconductor element 700. The heat-exchanging module 450 is disposed on the main body 400. The gas chamber device 500 is disposed between the grasping portion 440 and the heat-exchanging module 450, and is thermally connected to the grasping portion 440 and the heat-exchanging module 450, so as to enhance thermal exchange between the grasping portion 440 and the heat-exchanging module 450. Thus, when the carrying device 300 carries the semiconductor element 700, moves to a position above the recess 210 of the test socket 200, and downwardly presses against the semiconductor element 700 onto the test socket 200, the semiconductor element 700 is electrically connected to the circuit board 100 through the connection portions 211 arranged in the test socket 200.

Furthermore, the gas chamber device 500 includes a case body 510 and gas 600. The case body 510 is disposed in the main body 400, and is interposed between the grasping portion 440 and the heat-exchanging module 450. The case body 510 is thermally connected to the semiconductor element 700 and the heat-exchanging module 450. For example, a bottom surface 512 of the case body 510 flatly contacts a top surface 701 of the semiconductor element 700. The case body 510 is formed with a closed chamber 514 therein. The gas 600 fills the closed chamber 514 for transferring heat from the semiconductor element 700 to the heat exchanging module 450. For example but not limited thereto, a specific heat capacity of the gas 600 is in a range from about 5000 to about 15000 J/(kg·K), that is, the range includes 5000 J/(kg·K) and 15000 J/(kg·K).

It is noted, because the specific heat capacity of the specific gas 600 of the carrying device 300 is relatively high, the specific gas 600 may act as a buffer area for absorbing heat so as to delay the time of reaching the heat balance. Thus, the temperature of the gas chamber device 500 will not be increased rapidly, so that heat on the semiconductor element 700 will not be accumulated rapidly on the main body 400, so as to reduce thermal impact on the semiconductor element 700 due to heat of the main body 400 thereby reducing the possibilities of overheating and damaging the semiconductor element 700 due to the thermal accumulation issue, and preventing test data of the semiconductor element 700 from being not accurate enough and affecting the test results.

In the embodiment, for example but not to be limited thereto, the thermal conductivity of the gas 600 is in a range from about 0.1 w/(m·° C.) to about 1.14 w/(m·° C.), that is, the thermal conductivity ratio of the gas 600 and the atmospheric air is from about 5 to about 7. The range from about 0.1 w/(m·° C.) to about 1.14 w/(m·° C.) includes 0.1 w/(m·° C.) and 1.14 w/(m·° C.). By way of example only, the gas 600 is hydrogen or helium. The thermal conductivity of hydrogen is 0.13580 w/(m·° C.), that is, the thermal conductivity ratio of hydrogen and the atmospheric air is 7.08. Also, the specific heat capacity of hydrogen is 14000 J/(kg·K). The thermal conductivity of helium is 0.11680 w/(m·° C.), that is, the thermal conductivity ratio of helium and the atmospheric air is 6.18. Also, the specific heat capacity of helium is 5190 J/(kg·K). It is noted that, one with ordinary skills in the field of the present disclosure may consider using hydrogen or helium as the aforementioned gas 600 within the gas chamber device 500.

In the embodiment, the material of the case body 510 is a metal or an alloy, such as copper or aluminum, but the present disclosure is not limited to the material of the case body 510. In another embodiment, the material of the case body 510 may also be a nonmetal having high thermal conductivity material. Thus, the case body 510 can rapidly conduct the heat of the semiconductor element 700 to the heat exchanging module 450, so that the heat exchanging module 450 removes the heat rapidly from the main body 400.

More specifically, in the embodiment, for example but not to be limited thereto, the heat exchanging module 450 is an air-cooled heat-dissipating module, and includes a fluid inlet 451, a fluid outlet 452 and a fluid passage 453. The fluid passage 453 is disposed on the main body 400, and is in communication with the fluid inlet 451 and the fluid outlet 452, and the fluid passage 453 thermally contacts the gas chamber device 500. The fluid passage 453 has a single caliber size. The fluid passage 453 is, for example, a through passage formed directly in the main body 400 or a metal pipe disposed in a through passage in the main body 400. Thus, when high-pressure and room-temperature gas AR fills the fluid passage 453 through the fluid inlet 451, the high-pressure and room-temperature gas AR flows quickly into the fluid passage 453, and then leaves the main body 400 from the fluid outlet 452. At this moment, the high-pressure and room-temperature gas AR is able to carry the heat of the fluid passage 453 away from the main body 400 quickly. In addition, since the height of the fluid inlet 451 is greater than the height of the fluid outlet 452, the speed of the high-pressure and room-temperature gas AR flowing in the fluid passage 453 can be increased when the high-pressure and room-temperature gas AR flows downwards to the fluid outlet 452 from the fluid inlet 451. However, the present disclosure is not limited thereto, and the heat exchanging module in another embodiment may also be a liquid-cooled heat-dissipating module.

More specifically, in the embodiment, the main body 400 includes a moving arm 410 and a pressing portion 420. The heat-exchanging module 450 is installed in the moving arm 410. The pressing portion 420 is fixedly connected to one end of the moving arm 410 facing towards the recess 210, and is connected to the moving arm 410 and the grasping portion 440. In other words, the grasping portion 440 is disposed on one end of the pressing portion 420 opposite to the moving arm 410, and the gas chamber device 500 is interposed between the moving arm 410 and the pressing portion 420. However, the present disclosure is not limited thereto, and the pressing portion 420 in another embodiment also can be pluggably connected to the moving arm 410.

In the embodiment, the case body 510 of the gas chamber device 500 further includes two heat-sink fin arrays 520. Each of the heat-sink fin arrays 520 is disposed on a surface (i.e., a top surface 511) of the case body 510 opposite to the grasping portion 440, and thermally contacts an outer wall of the fluid passage 453 of the heat-exchanging module 450 so as to increase the contact area of the thermal connection to the heat-exchanging module 450.

More specifically, each of the heat-sink fin arrays 520 includes plural fin members 521 which are spaced apart and parallel to each other. In the embodiment, each of the fin members is made of metal, and is formed as an integrally formed structure with the case body 510. Each of the fin members 521 is hollow and a subspace 522 is formed therein, and each of the subspaces 522 is in communication with the aforementioned gas 600 within the closed chamber 514. Each of the subspaces 522 belongs to a portion of the closed chamber 514, that is, the aforementioned gas 600 is able to directly contact each of the fin members 521 in the corresponding subspace 522 thereof so as to increase the contact area of the thermal connection to the heat-exchanging module 450. For example but not to be limited thereto, the fluid passage 453 is thermally connected to both of the top surface 511 of the case body 510 and the fin members 521 of the heat-sink fin arrays 520, so as to provide a greater contact area of the thermal connection of the gas chamber device 500 to the heat-exchanging module 450. Also, the fin members 521 are arranged at intervals on one surface (i.e., a top surface 511) of the case body 510 opposite to the grasping portion 440. For example, the fin members 521 are arranged in an array on a surface (i.e., a top surface 511) of the case body 510 opposite to the grasping portion 440, and each of the fin members 521 is formed in a cylindrical shape or a square shape.

Furthermore, the present disclosure is not limited to the number of the heat-exchanging module 450. For example, the carrying device 300 in the embodiment is provided with two heat exchanging modules 450. The heat exchanging modules 450 are symmetrically located on the main body 400, and thermally connect a portion of the fin members 521 respectively.

Figure 2:
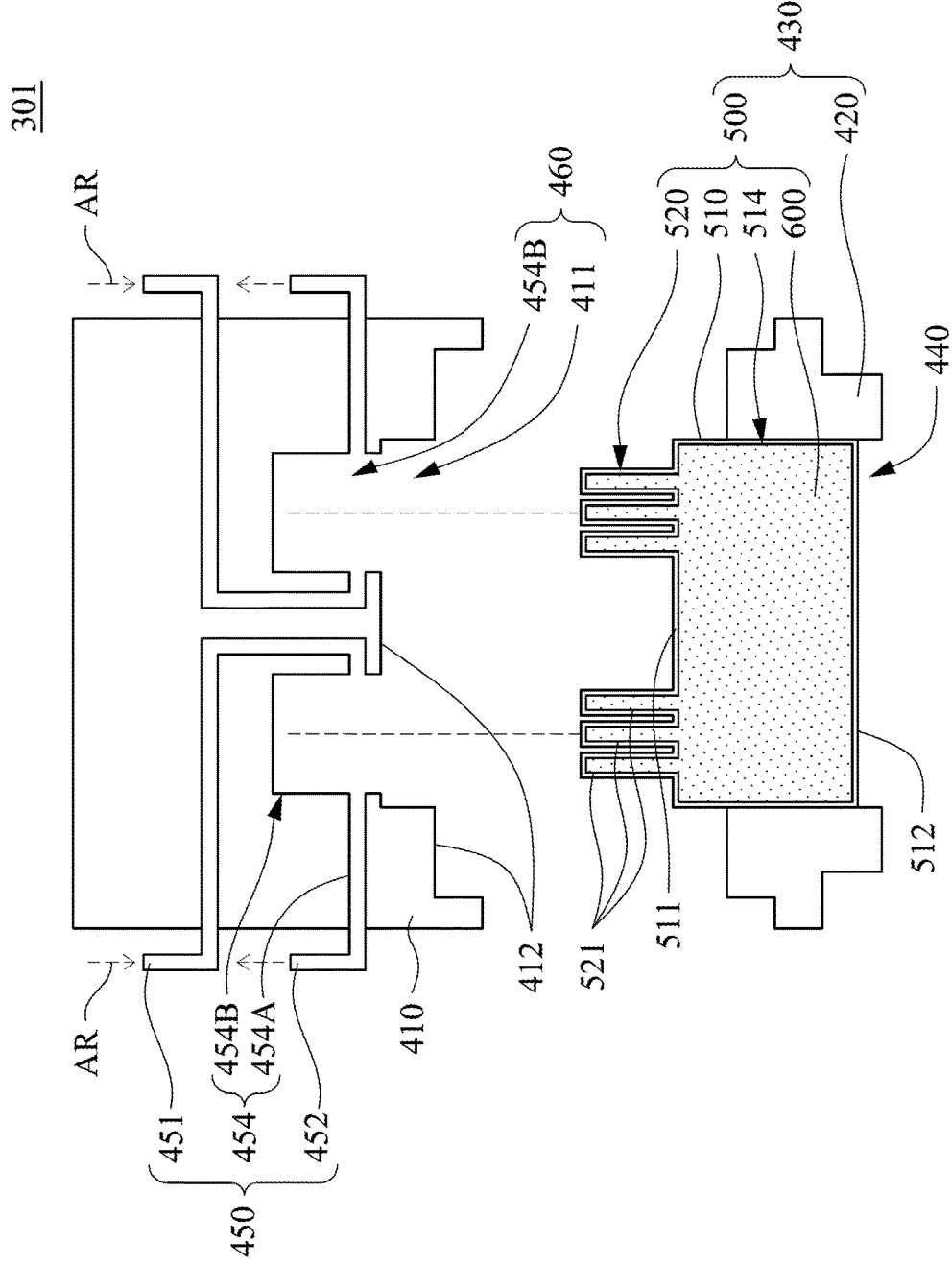
FIG. 2 is an exploded view of a carrying device according to one embodiment of the present disclosure.

FIG. 2 is an exploded view of a carrying device 301 according to one embodiment of the present disclosure. As shown in FIG. 1 and FIG. 2, the carrying device 301 of FIG. 2 and the carrying device 300 of FIG. 1 are substantially the same, in which the same elements are given the same numerical references in FIG. 2, but at least one difference of the carrying device 301 of FIG. 2 from the carrying device 300 of FIG. 1 is that one end surface of the moving arm 410 facing towards the pressing portion 420 is provided with at least one inserted slot 411. Each of the fluid passages 454 is not with only single one caliber size, that is, each of the fluid passages 454 may have different caliber sizes in different parts. Each of the fluid passages 454 is provided with a passage body 454A and a flow channel trench 454B. The caliber size of the flow channel trench 454B is greater than the caliber size of the passage body 454A. The passage body 454A is disposed in the moving arm 410. The flow channel trench 454B is located between two portions of the passage body 454A, and is in communication with the inserted slot 411 and the two portions of the passage body 454A. The inserted slot 411 and the flow channel trench 454B are formed together to be a combination recess 460. The gas chamber device 500 is fixedly disposed on one side of the pressing portion 420 facing towards the inserted slot 411, so that the gas chamber device 500 and the pressing portion 420 are mutually assembled to be a replacement member 430. A partial outline of the replacement member 430 is cooperatively matched with the combination recess 460, so that the replacement member 430 is pluggably received in the combination recess 460. When the replacement member 430 is not plugged into the combination recess 460 yet, the flow channel trench 454B is shown as an open trough. On the other hand, when the replacement member 430 is plugged into the combination recess 460, each of the heat-sink fin arrays 520 enters one of the channel trenches 454B, and the top surface 511 of the case body 510 is tightly pressed against the inner wall 412 of the inserted slot 411 so as to tightly cover the flow channel trench 454B. Thus, the high-pressure and room-temperature gas AR will not leak outwardly to the inserted slot 411 from the channel trenches 454B. Hence, since the semiconductor elements with different top areas can be respectively selected to be thermally connected to a case body 510 having a matched size thereof, when any size of the replacement member 430 is planned to be combined with the moving arm 410, the replacement member 430 can be detachably assembled to the moving arm 410 by inserting the heat-sink fin array 520 of the replacement member 430 into the inserted slot 411 of the moving arm 410.

It is noted that, one with ordinary skills in the field of the present disclosure may fill the inserted slot 411 with a thermally conductive media (e.g., thermally conductive gel, not shown in figures), such that the thermally conductive media is sandwiched between the heat-sink fin arrays 520 and the fluid passages 454 so as to increase contact areas of the heat-sink fin arrays 520 to be thermally connected to the fluid passages 454 of the heat exchanging modules 450.

Figure 3:
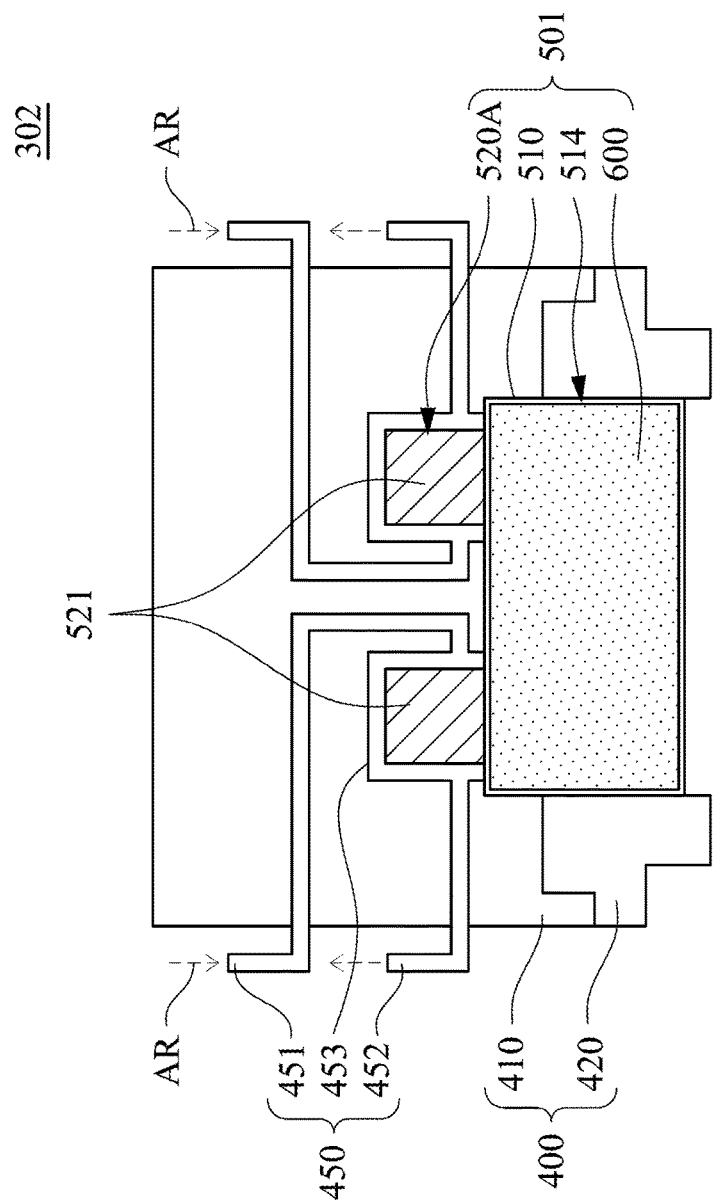
FIG. 3 is a side view of a carrying device according to one embodiment of the present disclosure.

FIG. 3 is a side view of a carrying device 302 according to one embodiment of the present disclosure. As shown in FIG. 1 and FIG. 3, the carrying device 302 of FIG. 3 and the carrying device 300 of FIG. 1 are substantially the same, in which the same elements are given with the same numerical references in FIG. 3, but, at least one difference between the carrying device 302 of FIG. 3 and the carrying device 300 of FIG. 1 is that each of the fin members 521 of heat-sink fin arrays 520A of the gas chamber device 501 is solid, and thus each of the fin members 521 is a solid body. Compared to the hollow body, the solid body can accumulate more heat to be conducted away by the heat exchanging module 450. For example, but not to be limited thereto, the fluid passage 453 is also thermally connected to the top surface 511 of the case body 510 and at least three sides of each of the fin members 521 provide greater a contact area of the thermal connection of the gas chamber device 500 to the heat-exchanging module 450.

Furthermore, in the embodiment, the heat-sink fin arrays 520A is removably connected to the case body 510, but the present disclosure is not limited thereto. In another embodiment, the heat-sink fin arrays also can be integrally formed on the case body.

Figure 4A:
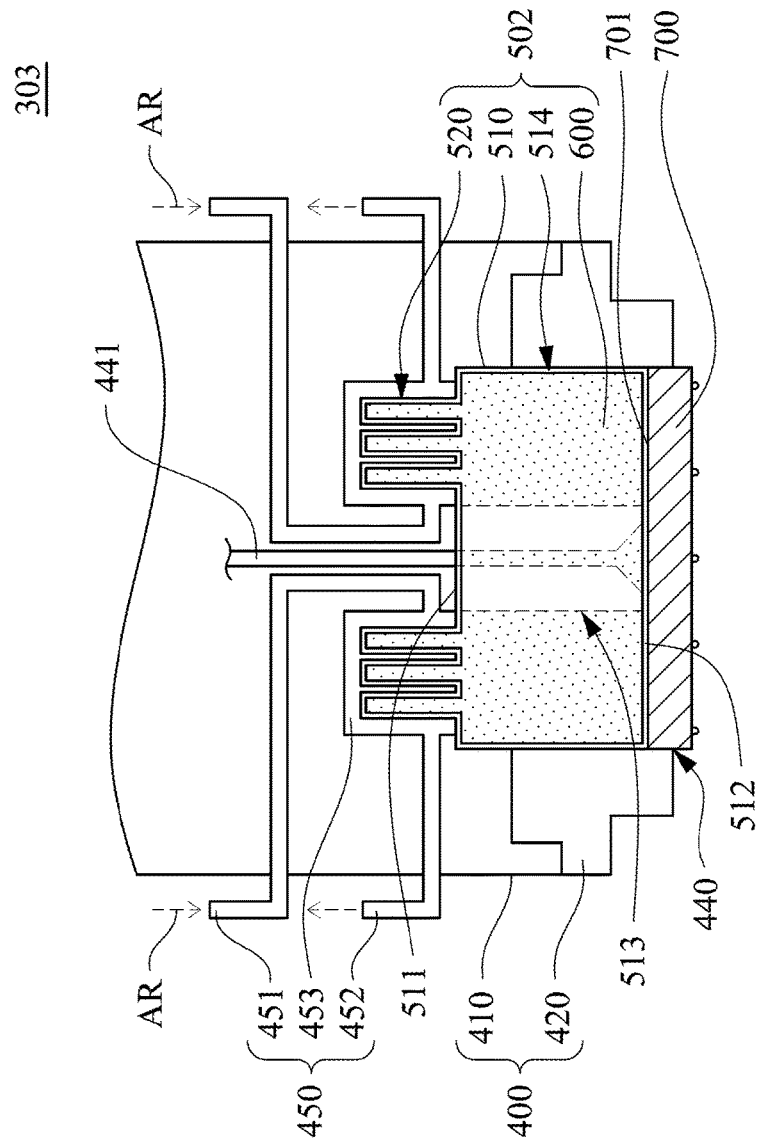
FIG. 4A is a side view of a carrying device according to one embodiment of the present disclosure.
Figure 4B:
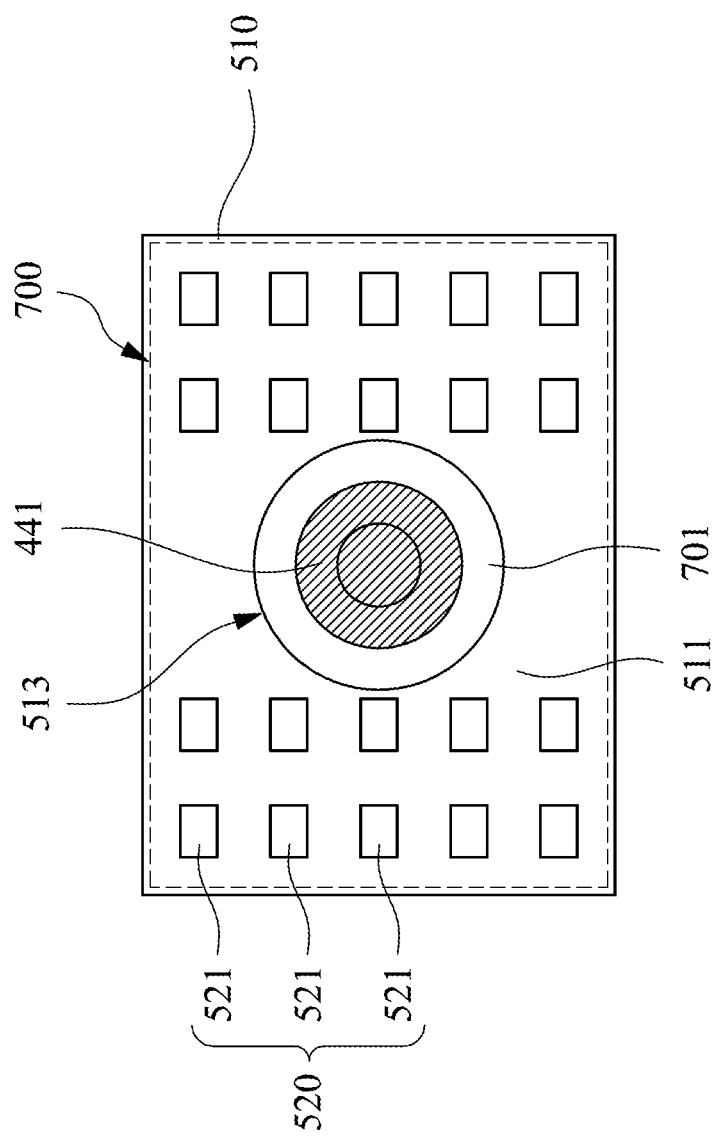
FIG. 4B is a top view of the gas chamber device of FIG. 4A.

Reference is now made to FIG. 4A and FIG. 4B, in which FIG. 4A is a side view of a carrying device 303 according to one embodiment of the present disclosure, and FIG. 4B is a top view of the gas chamber device 502 of FIG. 4A. As shown in FIG. 4A and FIG. 4B, the carrying device 303 of FIG. 4A and the carrying device 300 of FIG. 1 are substantially the same, in which the same elements are given with the same numerical references in FIG. 4A, but at least one difference of the carrying device 303 of FIG. 4A from the carrying device 300 of FIG. 1 is that the case body 510 is formed in a ring shape, and the case body 510 surrounds and defines a through hole 513 which is isolated from the gas 600 contained within the case body 510, namely, the closed chamber 514 surrounds the through hole 513. The grasping portion 440 includes at least one vacuum device 441 disposed in the main body 400. The vacuum device 441 includes a nozzle and a pipe (not shown). One end of the vacuum device 441 is connected to a vacuum equipment (not shown), and the other end of the vacuum device 441 extends to the bottom surface 512 of the case body 510 through the through hole 513 to adsorb the semiconductor element 700 by the vacuum force of the vacuum equipment.

Therefore, in the carrying device 303 of FIG. 4A, aside from the part of the through hole 513, the bottom surface 512 of the case body 510 can be in contact with most of the area of the top surface 701 of the semiconductor element 700 as much as possible, so as to maintain a certain heat dissipation performance.

Figure 5:
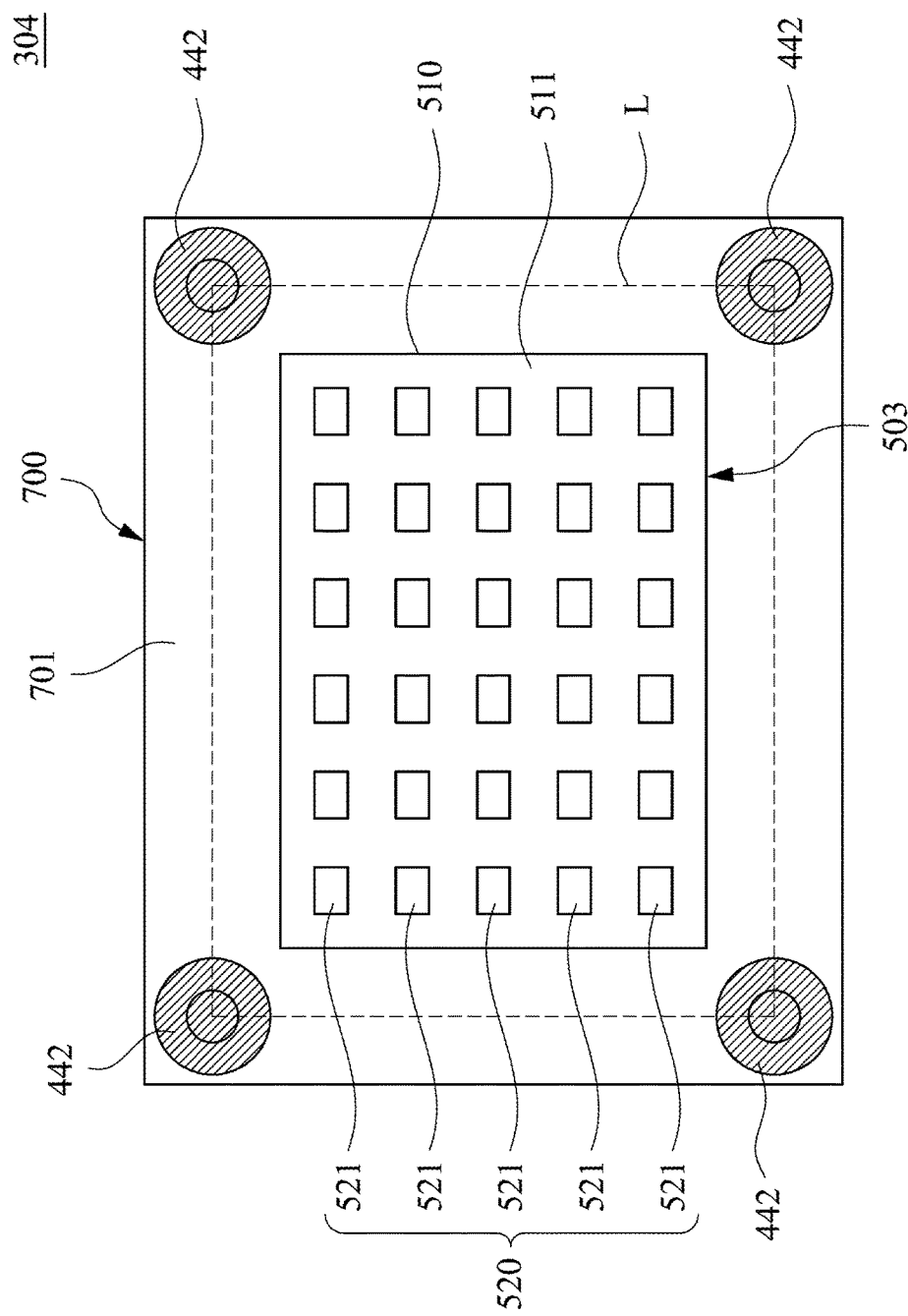
FIG. 5 is a top view of a gas chamber device of a carrying device according to one embodiment of the present disclosure.

FIG. 5 is a top view of a gas chamber device 503 of a carrying device 304 according to one embodiment of the present disclosure. As shown in FIG. 4A, FIG. 4B and FIG. 5, the carrying device 304 of FIG. 5 and the carrying device 303 of FIG. 4A and FIG. 4B are substantially the same, in which the same elements are given with the same numerical references in FIG. 5, but, at least one difference between the carrying device 304 of FIG. 5 and the carrying device 303 of FIG. 4A and FIG. 4B is that the case body 510 of the gas chamber device 503 does not have a through hole thereon, and the grasping portion 440 includes plural vacuum devices 442. The vacuum devices 442 are arranged at intervals in the main body 400 (refer to FIG. 4A) for adsorbing different positions of the top surface 701 of the semiconductor element 700, so as to ensure the grasping strength to the semiconductor element 700. Each of the vacuum devices 442 includes a nozzle and a pipe (not shown). One end of each of the vacuum devices 442 is connected to a vacuum equipment (not shown), and the other end thereof adsorbs the semiconductor element 700 by the vacuum force of the vacuum equipment. For example, four devices 442 are not connected to the case body 510, but are separated from the case body 510, and each of the four devices 442 is located at one position neighboring to one of corners of the case body 510, or each of the four devices 442 is located at one of the corners of the case body 510. In other words, if the vacuum devices 442 are arranged to define an area (see dotted box L, FIG. 5), the case body 510 is completely disposed in the area (see dotted box L, FIG. 5).

Therefore, since the case body 510 of the gas chamber device 503 does not have to form a through hole thereon, not only the production cost of the carrying device 304 can be reduced, but also a closed chamber without partitions can be provided.

It is noted that, the term "thermally connected" or "thermal connection" described above are referred to an element is in direct or indirect contact with another element so that heat can be effectively transferred to another element from the element for the purpose of heat exchange.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A carrying device, comprising:
    a main body comprising a moving arm and a pressing portion connected to one end of the moving arm;
    a grasping portion connected to the main body and disposed on one end of the pressing portion opposite to the moving arm, for grasping a semiconductor element;
    a heat-exchanging module disposed on the main body, and disposed in the moving arm; and
    a gas chamber device, comprising:
        a case body disposed between the grasping portion and the heat-exchanging module, and disposed in the pressing portion and the moving arm, wherein the case body has a closed chamber therein; and
        a gas filling the closed chamber for transferring heat from the semiconductor element to the heat exchanging module, wherein a specific heat capacity of the gas is substantially in a range from 5000 J/(kg·K) to 15000 J/(kg·K).

2. The carrying device of claim 1, wherein the gas is one of hydrogen and helium.

3. The carrying device of claim 1, wherein a surface of the case body opposite to the grasping portion is provided with a heat-sink fin array which thermally contacts the heat-exchanging module.

4. The carrying device of claim 3, wherein the heat-sink fin array comprises a plurality of fin members, wherein each of the fin members is solid; or each of the fin members is hollow and has a subspace therein belonging to a portion of the closed chamber.

5. The carrying device of claim 3, wherein one end of the moving arm facing towards the pressing portion is provided with an inserted slot that is thermally connected to the heat-exchanging module, wherein the heat-sink fin array is pluggably disposed within the inserted slot.

6. The carrying device of claim 3, wherein the heat-exchanging module comprises a fluid inlet, a fluid outlet and a fluid passage, and the fluid passage is disposed on the main body and is in communication with the fluid inlet and the fluid outlet.

7. The carrying device of claim 6, wherein the fluid passage is provided with a flowing channel therein that is in communication with the fluid inlet and the fluid outlet, and the heat-sink fin array is disposed within the flowing channel, and the surface of the case body of the gas chamber device which is opposite to the grasping portion tightly covers the flowing channel.

8. The carrying device of claim 1, wherein the grasping portion comprises:
    at least one vacuum device disposed in the main body, wherein the case body is formed in a ring shape, and the case body surrounds and defines a through hole which is isolated from the gas filling the closed chamber, and the vacuum device adsorbs the semiconductor element through the through hole.

9. The carrying device of claim 1, wherein the grasping portion comprises:
    a plurality of vacuum devices arranged at intervals in the main body for adsorbing the semiconductor element, wherein the vacuum devices define an area, and the case body is completely disposed in the area.

10. A testing equipment comprising:
    a circuit board;
    a test socket that is disposed on and connected to the circuit board; and
    a carrying device of claim 1 for carrying the semiconductor element and pressing against the semiconductor element onto the test socket, and electrically connecting the semiconductor element to the circuit board through the test socket.

* * * * *